United States Patent [19]

Kurosawa et al.

[11] Patent Number: 5,112,133
[45] Date of Patent: May 12, 1992

[54] ALIGNMENT SYSTEM

[75] Inventors: Hiroshi Kurosawa, Atsugi; Koji Uda, Yokohama; Kunitaka Ozawa, Isehara; Shunichi Uzawa, Tokyo; Ryuichi Ebinuma, Kawasaki; Takao Kariya, Hino, all of Japan

[73] Assignee: Canon Kabushiki Kaisha, Tokyo, Japan

[21] Appl. No.: 769,495

[22] Filed: Oct. 1, 1991

Related U.S. Application Data

[63] Continuation of Ser. No. 572,623, Aug. 27, 1990, abandoned.

[30] Foreign Application Priority Data

Aug. 30, 1989 [JP] Japan .................... 1-221540

[51] Int. Cl.$^5$ ............................................ G01B 11/00
[52] U.S. Cl. .............................. 356/401; 250/491.1; 307/119; 340/686
[58] Field of Search .................... 356/399, 400, 401; 250/491.1, 548; 33/561; 307/116, 119; 340/686, 679

[56] References Cited

FOREIGN PATENT DOCUMENTS 0326425 8/1989 European Pat. Off. .
63-18623 1/1988 Japan .

Primary Examiner—F. L. Evans
Attorney, Agent, or Firm—Fitzpatrick, Cella, Harper & Scinto

[57] ABSTRACT

An alignment system usable in an exposure apparatus for printing a pattern of a mask on a wafer, for aligning the mask and the wafer, is disclosed. The system includes a plurality of position detecting devices; a plurality of driving stages corresponding to the position detecting devices, respectively, each driving stage being adapted to move a corresponding one of the position detecting devices two-dimensionally along a plane which is substantially opposed to the mask; a plurality of contacts corresponding to the position detecting devices, respectively, each contact being provided at an end portion of a corresponding one of the position detecting devices, along the plane and facing the pattern side; a detecting device for detecting mutual approach of the position detecting devices through at least one of the contacts; and a control device for controlling movement of at least one of the driving stages in accordance with the detection by the detecting device.

11 Claims, 10 Drawing Sheets

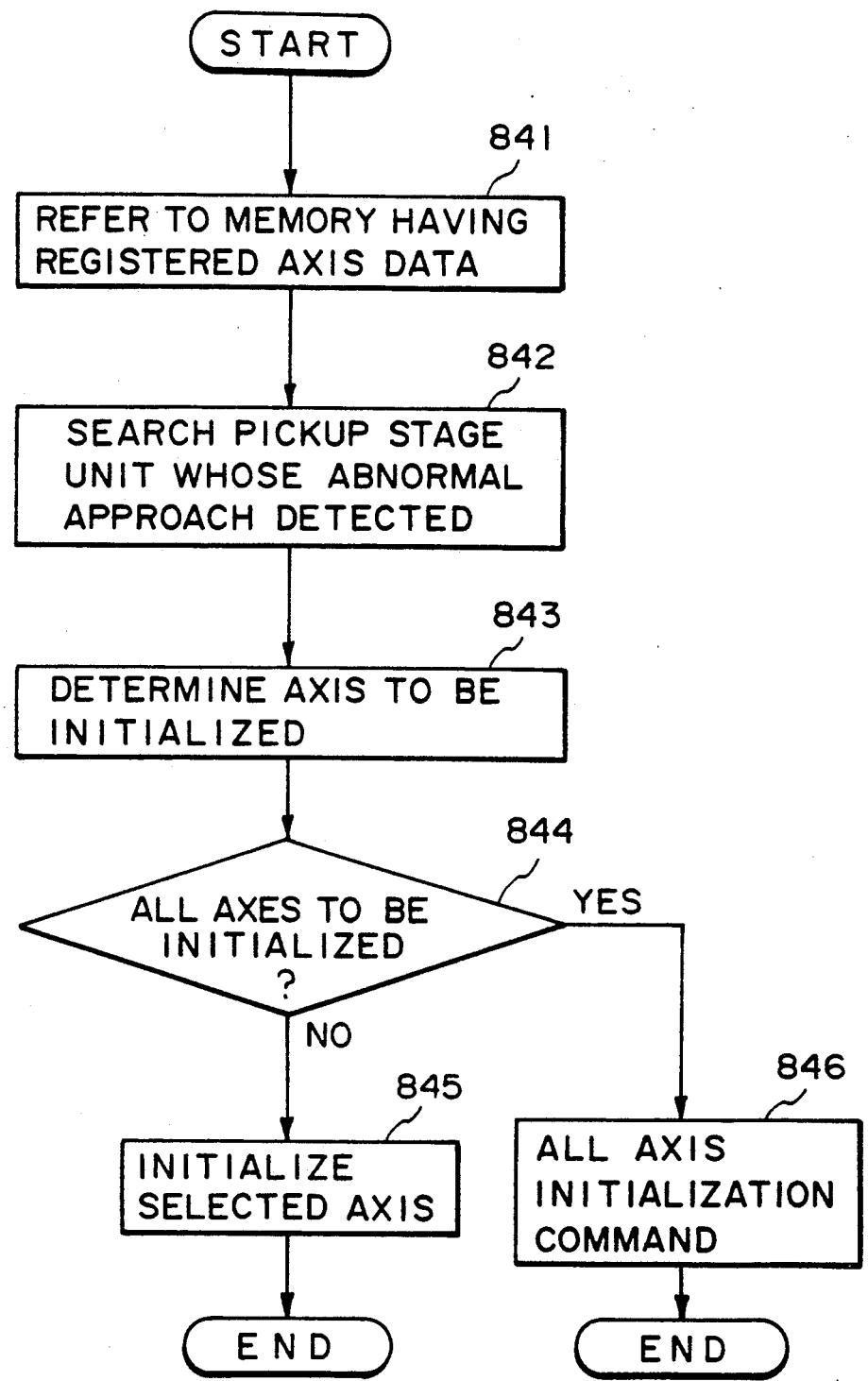
F I G. 9B

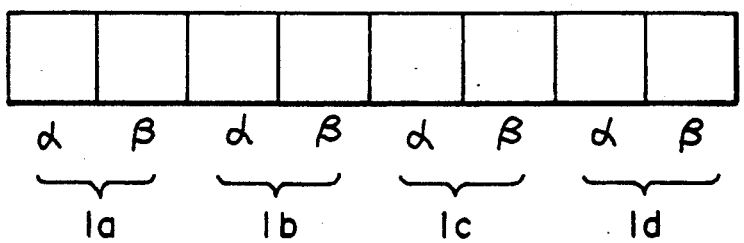
(b) 1 0 1 0 X X X X
(c) 0 1 0 1 X X X X
(d) 1 0 0 0 X X X X
(e) 0 1 0 0 X X X X
(f) 0 0 1 0 X X X X
(g) 0 0 0 1 X X X X
(h) THE OTHER COMBINATIONS
1 : DRIVE REGISTERED
0 : DRIVE NON-REGISTERED
X : DISCRIMINATION NOT REQUIRED
F I G. 10

ALIGNMENT SYSTEM

This application is a continuation of prior application, Ser. No. 07/572,623 filed Aug. 27, 1990, now abandoned.

FIELD OF THE INVENTION AND RELATED ART

This invention relates to an alignment system usable in an exposure apparatus for manufacture of semiconductor microcircuit devices, for detecting relative position of an original such as a mask and a workpiece such as a semiconductor wafer for alignment of them. More particularly, the invention is concerned with a control system in such an alignment system, for controlling movement of position detecting pickups of the alignment system.

An alignment system widely used in an exposure apparatus is one such that: alignment marks of a mask and a wafer are scanned with a laser beam or the like, and scattered light from these marks is photoelectrically converted into electric pulses. By measuring the pulse positions by using a counter or the like, the relative position is adjusted.

For example, an alignment mark (M1, M2) such as shown in part (a) of FIG. 3 is formed on a mask, while an alignment mark (W1, W2) such as shown in part (b) of FIG. 3 is formed on a wafer. By using a device of the structure as shown in FIG. 2, the alignment marks (M1, M2; W1, W2) of the mask and the wafer are scanned with a laser beam and the relative position (i.e. relative deviation) of the mask and the wafer is detected. In accordance with the detected deviation, at least one of the mask and the wafer is moved as to bring the alignment marks (M1, M2; W1, W2) into alignment with each other such as shown in part (c) of FIG. 3, whereby the relative alignment of the mask and the wafer is accomplished Here, one alignment mark (M1, M2) is provided at each of the left side portion and the right side portion of the mask. Namely, a pair of alignment marks are formed at the outside of a circuit pattern area of the mask On the other hand, one alignment mark (W1, W2) is formed at each of the opposite sides of each shot area of the wafer.

FIG. 2 is a schematic view of an exposure apparatus of reduction projection type, called a "stepper", which is known per se. Denoted in this Figure at 201 is a mask having a circuit pattern formed thereon; at 202 is a wafer which is a member to be exposed; and at 203 is a wafer stage. Denoted at 204 is a laser tube for producing a laser light to be used for the alignment operation; at 205 is a polygonal mirror; at 206 is a motor; at 207 is a prism; at 208 (208') is a beam splitter; at 209 (209') is an objective lens; at 210 (210') is a mirror; and at 211 is a projection lens system. Denoted at 212 (212') is a photoelectric detector; at 213 is a control circuit; at 214 is a binarizing circuit; at 215 is a measuring circuit; at 216 is a stage driving circuit; at 217 is a motor; at 218 is an input/output terminal; and at 219 is a display for the terminal 218. The display 219 is adapted to graphically display a shot layout 220 of a wafer 202. Denoted at 221 is the display which depicts the exposure regions (shot areas) of the wafer 202 Each time the exposure of one shot area is completed, a corresponding zone in the display is painted a predetermined color (e.g., green).

As described hereinbefore, the mask 201 is provided with two alignment marks M and M' each comprising mark elements such as depicted at M1 and M2 in FIG. 3, part (a). On the other hand, for each exposure region (shot area), the wafer 202 is provided with alignment marks W and W' each comprising mark elements such as depicted at W1 and W2 in FIG. 3, part (b).

In the structure described above, laser light emanating from the laser tube 204 is directed by the polygonal mirror 205 being rotated by the motor 206, and it is divided by the prism 207 into two for the paired marks M and W and the paired marks M' and W', respectively. The split laser beam goes by way of the beam splitter 208 (208'), the objective lens 209 (209') and the mirror 210 (210') and scans the alignment mark M (M') of the mask 201 and the alignment mark W (W') of the wafer. Scattered light from these marks goes by way of the mirror 210 (210'), the objective lens 209 (209') and the beam splitter 208 (208') and is received by the photoelectric detector 212 (212'). The photoelectric detector 212 (212') then photoelectrically converts the received light and produces an electric signal. This output is binary-coded by means of the binarizing circuit 214 of the control circuit 213. Then, from the binary-coded output, the measuring circuit 215 calculates the relative position of the paired marks (i.e. relative deviation of the marks (M1, W1; M2, W2) in the X and Y directions). On the basis of the detected deviation, the control circuit 213 calculates the amount of movement of the stage 203, to be provided, and instructs the stage 203 motion to the stage driving circuit 216 so as to bring the mask 201 and the wafer 202 into a correct positional relationship. After an such alignment operation is completed, the exposure operation is effected and a corresponding portion of the shot layout 220 of the wafer 202 as displayed in the display 219 is painted. Then, the sequence of exposure of the next shot area starts.

In such a conventional example, the mirror 210 (210') is movable in the X and Y directions, and it is controllably driven so as to ensure that the measuring light beam impinges on the alignment mark M (M') of the mask 201 irrespective of the position thereof. Also, with the alignment marks shown in FIG. 3, one pair (mark elements M1 and M2 and mark elements W1 and W2) allows measurement of the relative position with respect to both the X direction and the Y direction. As for each exposure shot, by using two pairs of such alignment marks, in relation to a corresponding view angle the relative position of the mask and the wafer with respect to the X, Y and $\theta$ directions can be calculated.

SUMMARY OF THE INVENTION

As for the alignment in recent exposure apparatuses, however, alignment precision of submicron order or more strict precision is required in order to meet further increases in the degree of integration of a semiconductor device. For example, it is estimated that, to ensure pattern printing of line-and-space of 0.5 micron, alignment measurement precision on an order of $3\sigma = 0.06$ micron is required.

As a method of attaining such precision, an alignment measuring method using diffraction gratings such as shown in FIG. 4 may be considered. In such an alignment measuring method, however, one alignment pattern is adapted to detect the relative position only in one direction (X or Y direction). Therefore, for measurement of the relative position of a mask and a wafer, at a current view angle, with respect to the X, Y and $\theta$ directions, at least three alignment patterns are necessary. Usually, for each view angle, four alignment patterns are provided. Therefore, in this type of an alignment measuring method, two or more alignment measuring optical system units (hereinafter, each will be referred to as a "pickup") have to be used. More particularly, when the four patterns are to be photoelectrically detected at the same time, four pickups have to be used.

When each of such pickups moves within and around the view angle with respect to a mask, independently of the others, there is a possibility that the spaces to be physically occupied by these pickups overlap with each other. In other words, there is a possibility of collision of the pickups. Such collision attributes to the mutual positional relationship of the pickups, and mere provision of protection switches such as end limit switches to the respective axes, driving these pickups, is not a fundamental solution to this problem.

A proposal for preventing collision of pickups has been made in Japanese Laid-Open Patent Application, Laid-Open No. Sho. 63-18623, wherein a moving member operationally associated with the motion of a pickup is separately provided outside the view angle at the mask side and, additionally, a microswitch or the like for detecting "approach" is mounted to this moving member. In this method, however, if the number of pickups increases, the mechanism has to be complicated and, therefore, the space to be occupied by each pickup becomes large. Therefore, if four pickups are used for observation through the view angle of one shot area, as described hereinbefore, the space factor is very restricted.

In consideration of these inconveniences, it is an object of the present invention to ensure detection of the approach of the pickups in an alignment mechanism, with a simple and compact structure.

In an alignment mechanism according to an aspect of the present invention, to achieve such an object, the mechanism includes a plurality of alignment units each for measuring the state of alignment of corresponding alignment marks of an original and a wafer workpiece, and driving mechanisms for moving these alignment units along predetermined driving axes, respectively, wherein each alignment unit is equipped with a contact, mounted to a mask side end of the unit, for detecting an extraordinary approach of alignment units.

Usually, the contact may comprise an electrode mounted to the free end portion of a corresponding alignment unit, and sensor means operates to detect mutual extraordinary approaches of alignment units through engagement of the corresponding contact.

Desirably, means may be provided to allow, when mutual extraordinary approach of alignment units is detected, motion of each alignment unit only in such a direction moving away from the other alignment unit.

In the detection of the state of alignment of alignment marks, if four alignment units (pickups) are movable within and around the view angle at the mask side, independently of each other, there is a possibility of collision of pickups. When each pickup is equipped with a contact mounted to the free end thereof and when extraordinary mutual approach of pickups is detected through these contacts, and/or when on such an occasion the motion of each pickup is allowed only in the direction moving away from the other pickup or pickups, the collision of the pickups moving in any direction due to malfunction or the like can be prevented effectively. Additionally, extraordinary approach of pickups is detected through contacts such as electrodes, for example, adapted to detect abutment electrically. Therefore, the sensor means can be made simple and compact, which leads to saving of space.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 9A and 9B are flow charts, respectively, showing other examples of a processing sequence to be effected upon extraordinary approach of pickups such as shown in FIG. 1.

FIG. 10 is a schematic representation, for explaining the reference for discrimination in the processing sequence of FIGS. 9A or 9B.

DESCRIPTION OF THE PREFERRED EMBODIMENTS

Figure 1:
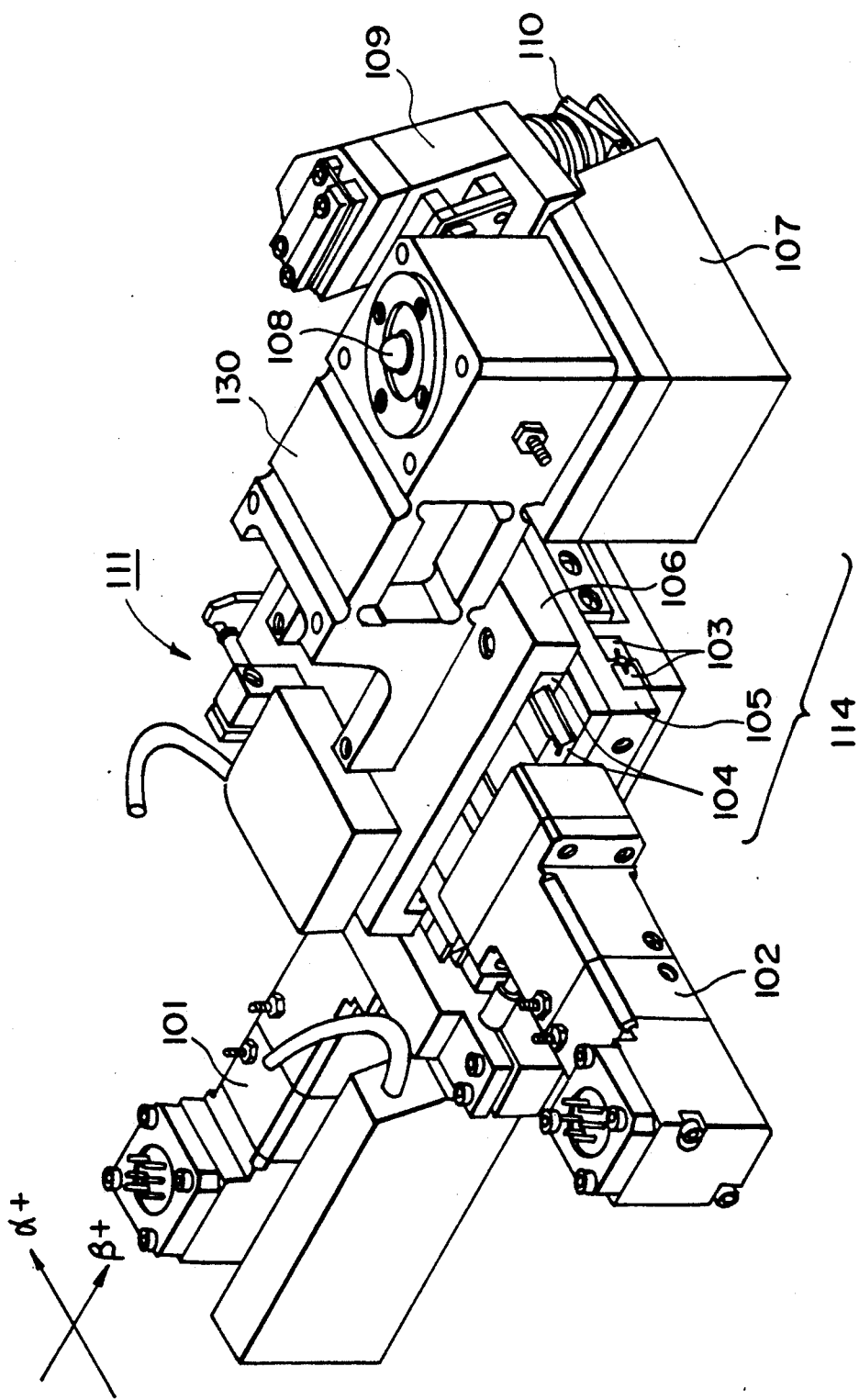
FIG. 1 is a perspective view of a pickup and a pickup stage, according to an embodiment of the present invention.
Figure 2:
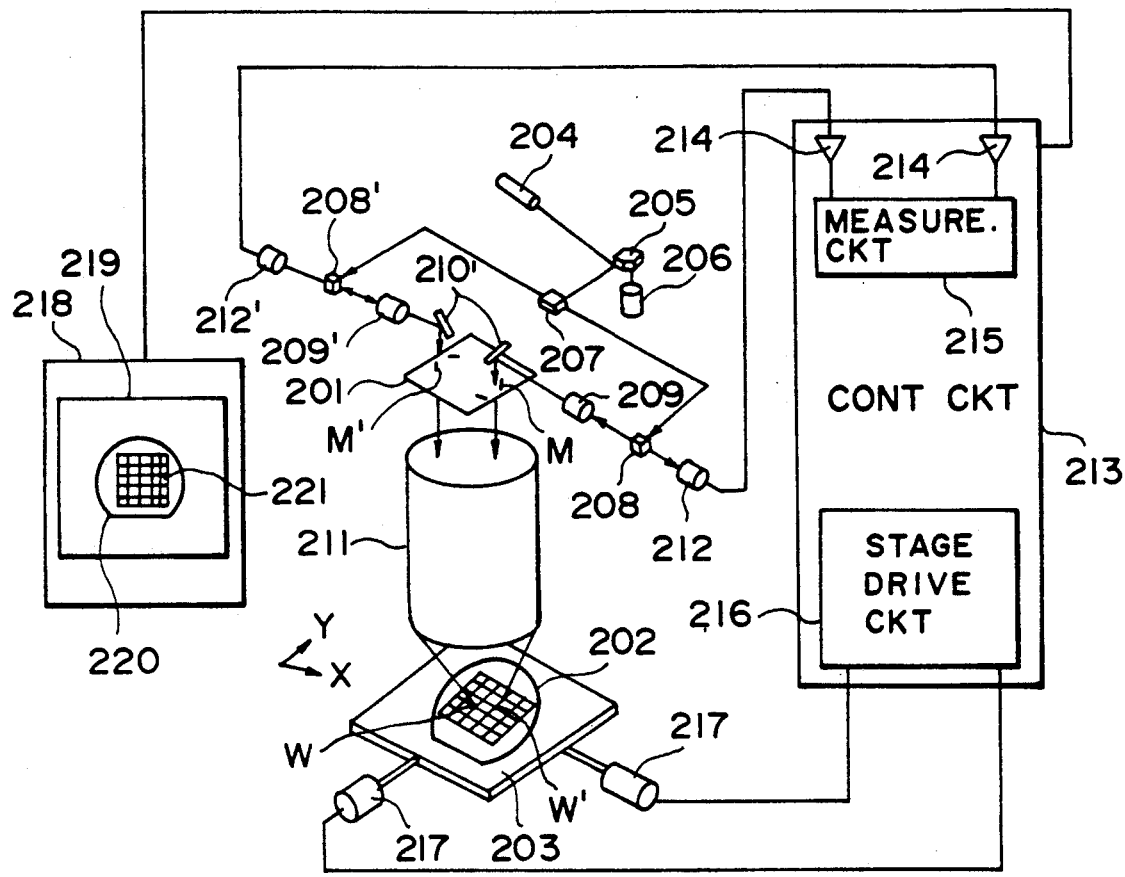
FIG. 2 is a schematic view of an alignment system in an exposure apparatus.
Figure 3:
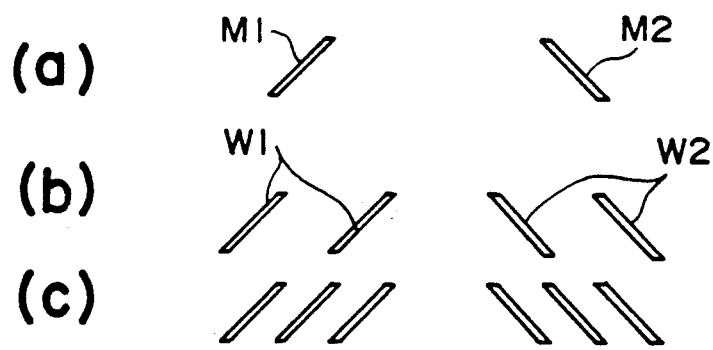
FIG. 3 is a schematic view showing in part (a) a mask alignment pattern and, in part (b), a wafer alignment pattern as well as, in part (c), mask and wafer alignment patterns when superposed.

FIG. 1 illustrates the appearance of a pickup 111 and a pickup stage 114 according to the present invention, which are used in a set. Denoted in this Figure at 105 is a $\beta$ axis stage which is guided by a $\beta$ axis cross roller guide 103 with respect to the $\beta$ axis direction; and denoted at 106 is an $\alpha$ axis stage which is guided by an $\alpha$ axis cross roller guide 104 with respect to the $\alpha$ axis direction, relative to the $\alpha$ axis stage 105. These two stages 105 and 106 can be controllably positioned by means of actuators (actuator units) 101 and 102, respectively, each being equipped with an encoder. Denoted at 108 is a push rod provided for clamping the pickup head. When the push rod 108 is moved into a protruded state, under the reaction of the pressing of the push rod 108 against an abutment (not shown), a pickup head 107 is pressed against a super flat surface (not shown). A barrel 109 having a fine autoalignment (AA) and autofocusing (AF) optical system accommodated therein, is mounted to the pickup head 107. The pickup head 107 is mounted for vertical movement, as viewed in the drawings, relative to the $\alpha$ axis stage 106 by means of a parallel leaf spring mechanism 130. Denoted at 110 is a contact (detector) provided at the free end of the barrel 109, for detection of mutual extraordinary approach of pickups. When this contact 110 is brought into engagement with another contact of another pickup 111, a main-part control unit 423 (FIG. 4), for controlling them, can discriminate the extraordinary approach of two pickups.

Figure 4:
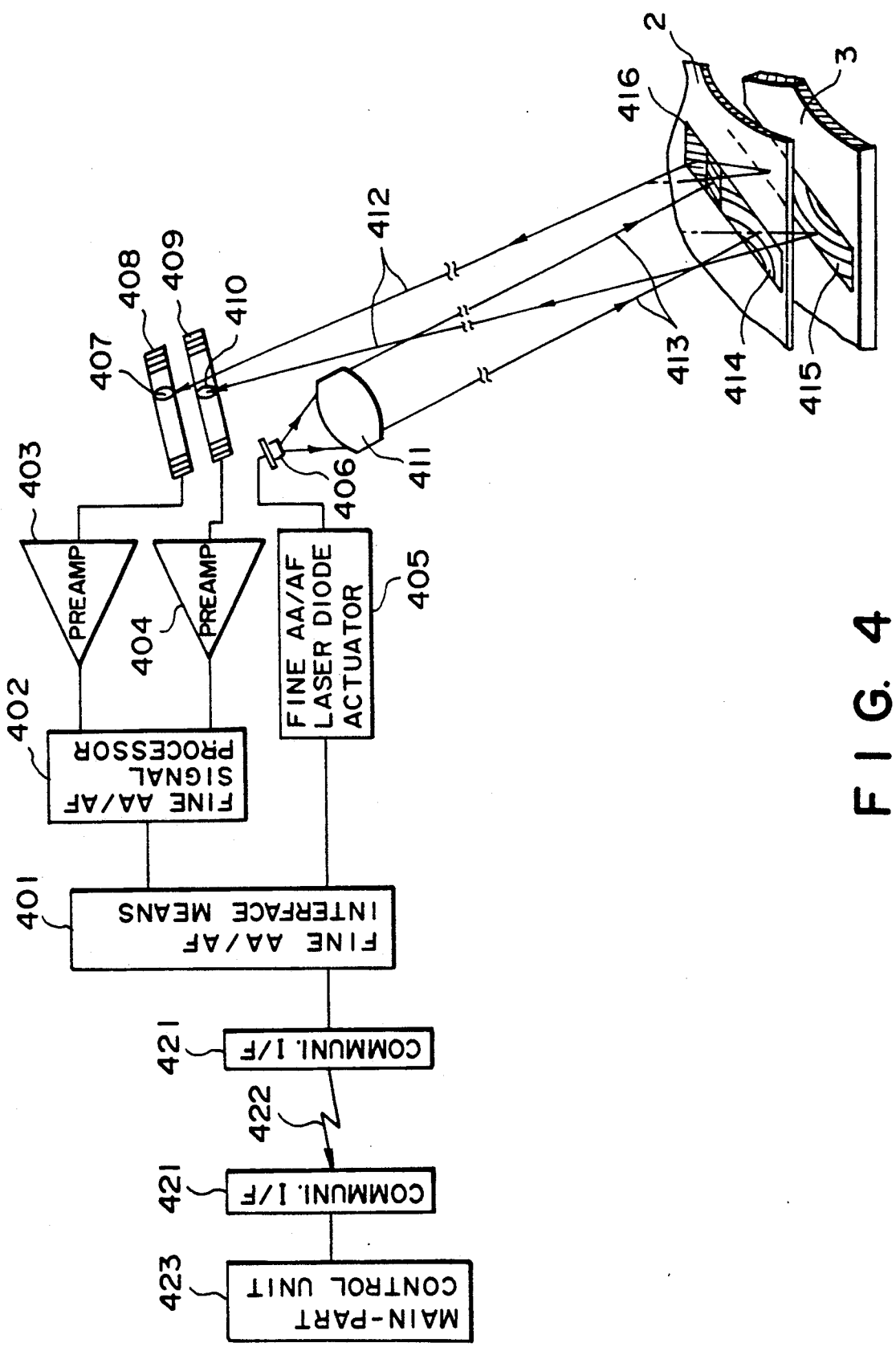
FIG. 4 is a schematic view of a high-precision alignment measuring system which uses the FIG. 1 arrangement and diffraction gratings.

FIG. 4 illustrates the structure which is concerned with the alignment measurement through the pickup described with reference to FIG. 1.

In the drawing, denoted at 422 is a communication line for communication with the control unit 423 having a central processing unit; at 421 is a communication interface for receiving instructions, supplied by way of the communication line 422, and for supplying alignment information or ga information; at 401 is a fine autoalignment (AA) and autofocusing (AF) interface for receiving instructions from the communication interface and for producing a signal for alignment measurement or gap measurement and also for supplying alignment information or gap information to the communication interface 421; at 405 is a fine AA and AF laser diode actuator for driving the semiconductor laser 406 at a light output as determined by the fine AA and AF interface 401. Denoted at 406 is a semiconductor laser (light emitting element); at 411 is a collimator lens for transforming light produced by the semiconductor laser 406 into a parallel light; at 413 is a projected beam outputted from the semiconductor laser 406; at 414 is an autofocusing (AF) mark formed on the mask 2, together with a semiconductor circuit pattern, by a material such as gold; at 416 is an autoalignment (AA) mark formed on the mask 2, together with the semiconductor circuit pattern, by a material such as gold; and at 415 is an autoalignment (AA) mark formed on the wafer 3, together with a semiconductor circuit pattern, in the preceding exposure shot by a semiconductor process.

Denoted at 412 are light beams, to be received, bearing alignment information and gap information obtainable through an optical system constituted by the mask AA mark 415, the wafer AA mark 415, the AF mark 414 and the wafer 3; at 407 is an autoalignment (AA) spot which is the light bearing the alignment information as obtainable through an optical system constituted by the mask AA mark 416 and the wafer AA mark 415; and at 410 is an autofocusing (AF) spot which is the light bearing the gap information as obtainable through an optical system constituted by the mask AF mark 414 and the wafer 3.

Denoted at 408 is an autoalignment (AA) sensor comprising a line sensor such as a CCD, for example, for receiving the AA spot 407 which is the light bearing the alignment information and for converting it into an electric signal; at 409 is an autofocusing (AF) sensor comprising a line sensor such as a CCD, for example, for receiving the AF spot 410 which is the light bearing the gap information and for converting it into an electric signal; at 403 is a preamplifier for amplifying the output of the AA sensor 408; and at 404 is another preamplifier for amplifying the output of the AF sensor 409. Denoted at 402 is a fine AA and AF signal processor which serves to process the output of the preamplifier 403 to thereby calculate the alignment information. Also, it serves to process the output of the preamplifier 404 to thereby calculate the gap information.

In the structure described, the alignment information (mask-to-wafer deviation) can be detected in the following manner: The fine AA and AF laser diode drive 405 drives the semiconductor laser 406 at a light output as set by the fine AA and AF interface 401, more specifically, at a sufficiently large output within a range with which the AA sensor 408 is not saturated. The light emanating from the semiconductor laser 406 goes through the collimator lens 411, and a projected light beam 413 is provided. The light beam 413 is transmitted through the mask AA mark 416 and is reflected by the wafer AA mark 415, whereby a light beam 412 to be received is provided. The light beam 412 impinges on the AA sensor 408 in the form of the AA spot 407.

The mask AA mark 416 and the wafer AA mark 415, constituting a double grating physical optic element, can transform a positional deviation between the mask 2 and the wafer 3 into a displacement (position) of the AA spot 407 with an enlarging magnification of "x100", for example. The output of the AA sensor 408 as it receives the AA spot 407, is amplified by the preamplifier 403 and the amplified output is inputted to the fine AA and AF signal processor 402. The signal processor 402 then detects the gravity center position of the AA spot 407 incident on the AA sensor 408. Then, while magnifying the deviation (position) of the gravity center of the AA spot at an enlarging magnification of 1:100, for example, it determines the positional deviation between the mask AA mark 416 and the wafer AA mark 415, namely, between the mask 2 and the wafer 3.

Also, the gap information can be detected in the following manner: The fine AA and AF laser diode drive 405 drives the semiconductor laser 406 at a light output as set by the fine AA and AF interface 401, more specifically, at a sufficiently large light output in a range with which the AF sensor 409 is not saturated. The light emanating from the semiconductor laser 406 goes through the collimator lens 414, and a projected light beam 413 is provided The light beam 413 is transmitted through the AF mark 414 and is reflected by the wafer 3, whereby a light beam 412 to be received is provided. The light beam 412 then impinges on the AF sensor 409 in the form of the AF spot 410.

The mask AF mark 414 which is constituted by two different grating lenses on the mask 2 can serve to transform the surface spacing between the mask 2 and the wafer 3 into a magnified displacement (position) of the AF spot 410, being magnified by an enlarging magnification of "x15", for example. The output of the AF sensor 409 is amplified by the preamplifier 404 and the amplified output is inputted to the fine AA and AF signal processor 402. The signal processor 402 then detects the gravity center position of the AF spot 410 incident on the AF sensor 409. Then, while magnifying the gravity center position of the AF spot 410 at an enlarging magnification of 1:15, it determines the surface spacing between the mask AF mark 414 and the wafer 3, namely, between the mask 2 and the wafer 3.

The fine AA and AF signal processor 402 may be provided by an analog circuit, or the output of the preamplifier 403 or 404 may be digitalized by an analog-to-digital converter (not shown) and then digital processed by a microcomputer, for example. Also, in response to an instruction from the main-part control unit 304, the fine AA and AF interface 401 can detect the alignment information or the ga information and transmit it, if required, to the main-part control unit 423 by way of the communication interfaces 421 and the communication line 422. The semiconductor laser 406, the collimator lens 411 and the line sensors 408 and 409 are all accommodated in a barrel 109 shown in FIG. 1.

Figure 5:
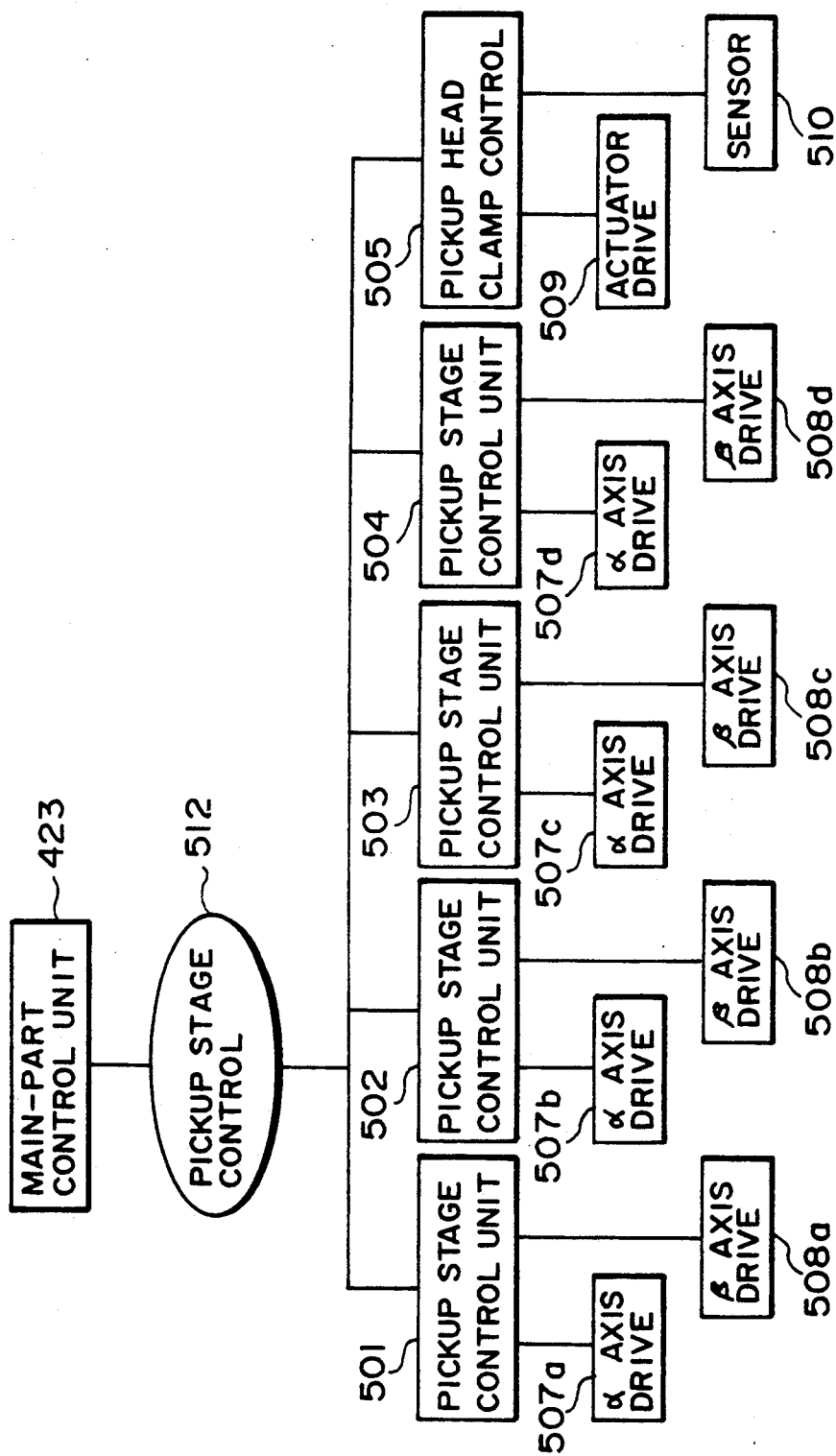
FIG. 5 is a block diagram illustrating electrical hardware for controlling the motion of pickup stages such as shown in FIG. 1.

FIG. 5 illustrates electrical blocks for controlling β direction actuator units and α direction actuator units of the pickup stages 114 shown in FIG. 1, and electrical blocks for controlling the mechanical clamping (push rod 108) of the pickups 111.

Referring to FIG. 5, the pickup stage controller 512 comprises pickup stage control units 501-504 (for the four pickups), and a pickup head clamp control means 505. The pickup stage control units 501-504 have a function for outputting the number of pulses corresponding to the moving distance, to α axis drives 507a-507d and β axis drives 508a-508d which are the drivers of the α direction actuator units and the β direction actuator units, as well as a function for setting the timing of pulse emission in accordance with a target position as transmitted from the main-part control unit 423, in the form of a trapezoidal drive pattern not imparting any impact to the pickup 111.

The α axis drives 507a-507d and the β axis drives 508a-508d each comprises a driver for a DC motor, and in response to an instruction from the main-part control unit 423 the gain of the servo loop can be reduced to zero, if desired. The pickup head clamp control means 505 comprises a drive 509 of an actuator to be used to press the pickup against a pickup reference surface (not shown) which is a super flat surface, in order to suppress any error of position control due to the pitching or rolling of the pickup 111. Also, the clamp control 505 further comprises sensor means 510 provided to discriminate the state of contact to the pickup reference surface. As regards the sensor means, each pickup stage is equipped with a sensor for the state of discrimination, and the sensor means 510 has inputs for a total of four channels.

Figure 6A:
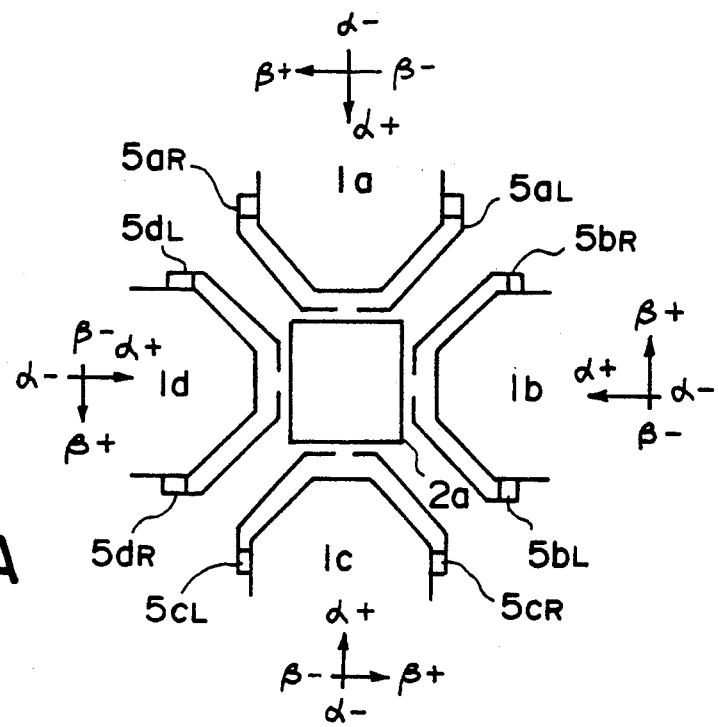
FIGS. 6A-6C are schematic views, respectively, showing different examples of pickups such as shown in FIG. 1, having bumpers mounted thereto.
Figure 6B:
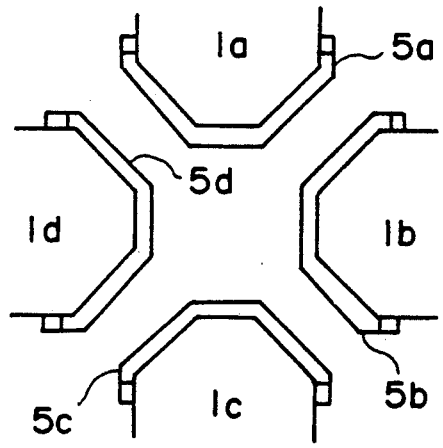
Figure 6C:
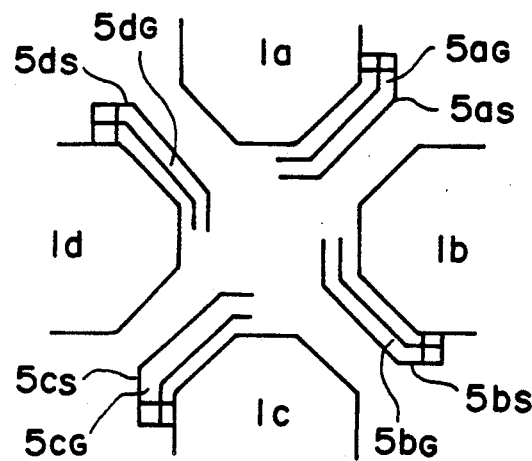

FIGS. 6A-6C illustrate an example of the manner of mounting the contact 310 (hereinafter "bumper") having been described with reference to FIG. 1. Each of FIGS. 6A-6C shows the positional relationship among a circuit pattern 2a of a mask 2 and four pickups 1a-1d (barrels 109), when the mask 2 is viewed in the direction in which the exposure light (e.g. synchrotron radiation light, X-rays, excimer laser light, light of g-line or i-line or the like) is projected to the circuit pattern of the mask. Since FIGS. 6B and 6C are similar to FIG. 6A with respect to the directions of driving axes as well as the position of the circuit pattern 2a, the illustration is simplified.

In FIGS. 6A-6C, reference characters 1a-1d denote pickups (barrels 109) provided in association with the four sides of the circuit pattern 2a. Reference characters 5aR-5dR and 5aL-5dL in FIG. 6A, the reference characters 5a-5d in FIG. 6B and the reference characters 5aG-5dG and 5aS-5dS in FIG. 6C, are the bumpers mounted to the pickups 1a-1d, respectively. As illustrated, each of the pickups 1a-1d has a free end formed into a trapezoidal shape with respect to a plane (α-β plane) perpendicular to the direction of projection of the exposure light. More specifically, at the free end of each pickup, the width with respect to the β axis direction gradually decreases toward the circuit pattern 2a side. Also, each bumper mounted to a corresponding pickup is formed by a resiliently deformable metal piece, and it has a free end at the circuit pattern 2a side and another end securedly fixed to the corresponding pickup so that the bumper extends substantially along the outer peripheral shape of the pickup in the α-β plane. Thus, between each bumper and a corresponding pickup to which the bumper is mounted, there is a small clearance with respect to the α-β plane. The bumpers exemplified in FIGS. 6A-6C each comprise an electrode to which the wiring is made in the manner illustrated in FIG. 7A, 7B or 7C, and the status is memorized into the control circuit 702.

In the example of FIG. 6A, each pickup is equipped with two pieces of bumpers which cooperate with each other to substantially enclose the free end portion of the corresponding pickup. In this example, by the contact of the bumpers of adjacent pickups, for example, by the contact of the bumpers 5aL and 5bR, extraordinary approach of adjacent pickups can be detected. This example has an advantage that common wiring and structure can be adopted for all the pickups 1a-1d.

FIG. 6B shows an example wherein each of the pickups 1a-1d is equipped with a single-piece bumper with an electric potential difference being provided between a pair of pickups (1a, 1c) and another pair of pickups (1b, 1d). Also in this example, each bumper extends to enclose the free end portion of a corresponding pickup. Since those bumpers which are possibly contactable with each other have mutually different electric potentials, the state of extraordinary approach, if any, can be detected by detecting a change in the electric potential. With this method, the mechanical structure of each pickup can be made simplest.

FIG. 6C shows an example wherein each pickup is equipped with a bumper at one side thereof (a side of each pickup facing to the −β axis direction) which bumper comprises a pair of contacts which are electrically contactable with each other when an external force is applied thereto. For example, if the pickups 1a and 1b mutually approach each other, the bumper (contact) 5aS mounted to the pickup 1a is pressed by the pickup 1b and is brought into contact with the bumper (contact) 5aG. Thus, by electrically detecting the state of such contact, it is possible to detect the state of extraordinary approach.

Figure 7A:
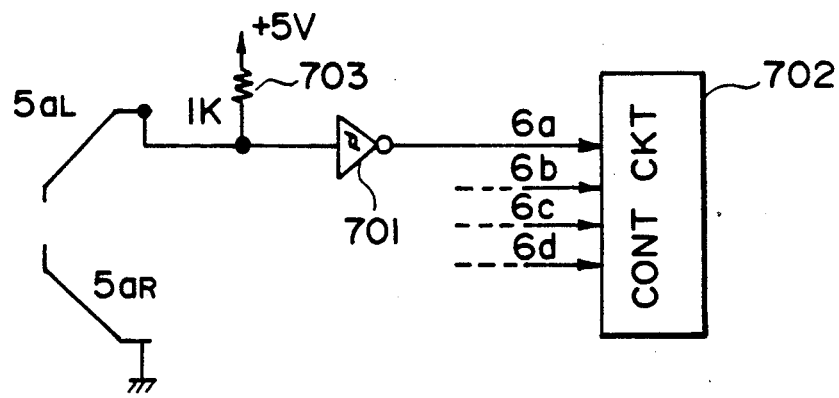
FIGS. 7A-7C are schematic views, respectively, showing electrical hardware corresponding to the arrangements of FIGS. 6A-6C, respectively, each for detecting the state of a corresponding bumper.

As best seen in FIG. 7A, all the bumpers 5aR-5dR (FIG. 6A) facing to the +β axis direction have their electric potentials maintained at the ground level (0 volt), while the bumpers 5aL-5dL facing to the −β axis direction are pulled up to +5 V through a resistance of 1 kilo-ohm. Accordingly, if for example the bumper 5bR contacts to the bumper 5aL, the potential of the bumper 5aL decreases. Through a Schmitt gate 701, a signal 6a corresponding to such a state is read by a control circuit 702. This is also true with the cases of the remaining three pickups 1b-1d, and similar signals 6b-6d can be read by the control circuit 702.

Figure 7B:
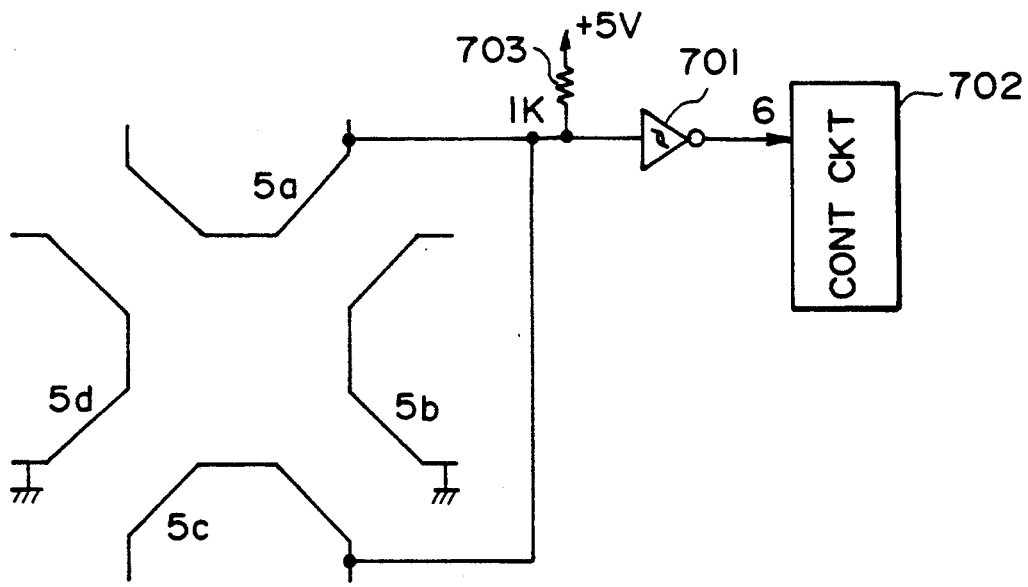

Referring now to FIG. 7B, the bumpers 5b and 5d shown in FIG. 6B have their electric potentials maintained at the ground level (0 volt), while the electric potentials of the bumpers 5a and 5c are "wired OR" through a pull-up resistance 703 of 1 kilo-ohm. This potential is signaled through a Schmitt gate 701 to the control circuit 702 as a condition signal 6.

Figure 7C:
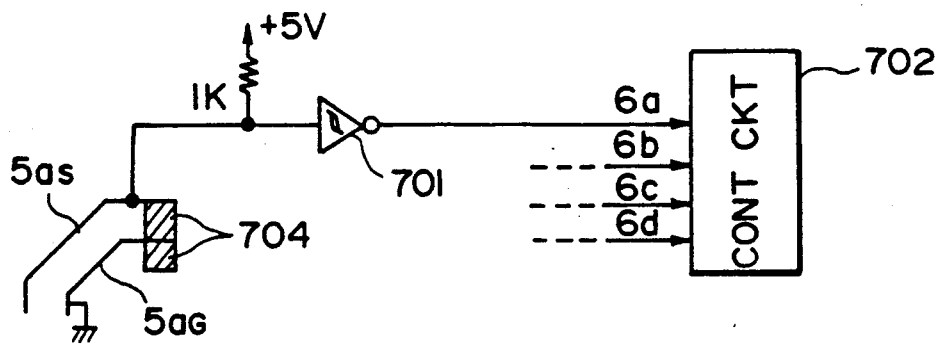

Referring to FIG. 7C, the bumpers 5aS and 5aG shown in FIG. 6C are separated from each other by an insulating member 704 which serves also as a support. The bumper 5aG is maintained at the ground level (0 volt), while the bumper 5aS is pulled up through a resistance of 1 kilo-ohm. This is also true with the cases of the other bumpers, and the signal processing is effected in a similar process as the example of FIG. 7A.

Figure 8A:
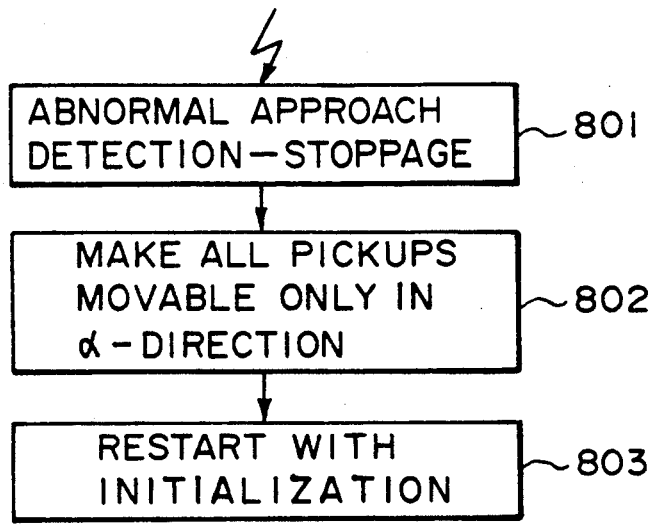
FIGS. 8A and 8B are flow charts, respectively, for explaining the processing sequences to be executed upon extraordinary approach of pickups such as shown in FIG. 1.
Figure 8B:
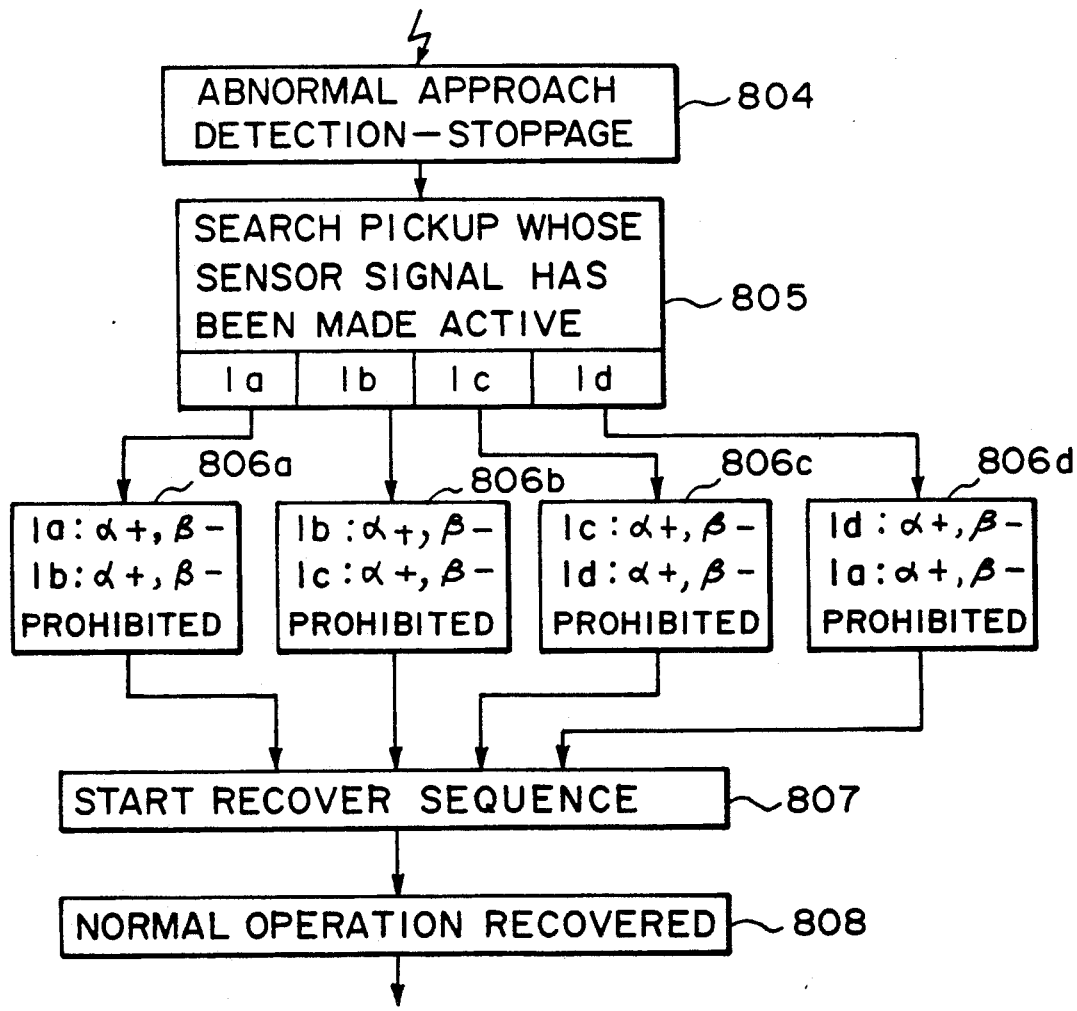

FIGS. 8A and 8B illustrate two examples of a processing sequence to be effected in response to detection of extraordinary approach of pickups.

In the sequence shown in FIG. 8A, if extraordinary approach is detected at step 801, then at step 802 the motion of all the pickups 1a-1d is stopped or prohibited temporarily and, thereafter, only the motion of each pickup in the α- direction (see FIG. 6A) is allowed. Namely, the four pickups 1a- 1d are allowed to be moved only in such directions that they are separated away from each other. Then, at step 803, after all four pickups move out of the collidable region, the origin setting of each of the pickup stages 114 for the pickups 1a-1d is effected by using an unshown origin setting sensor (restoration).

Figure 9A:
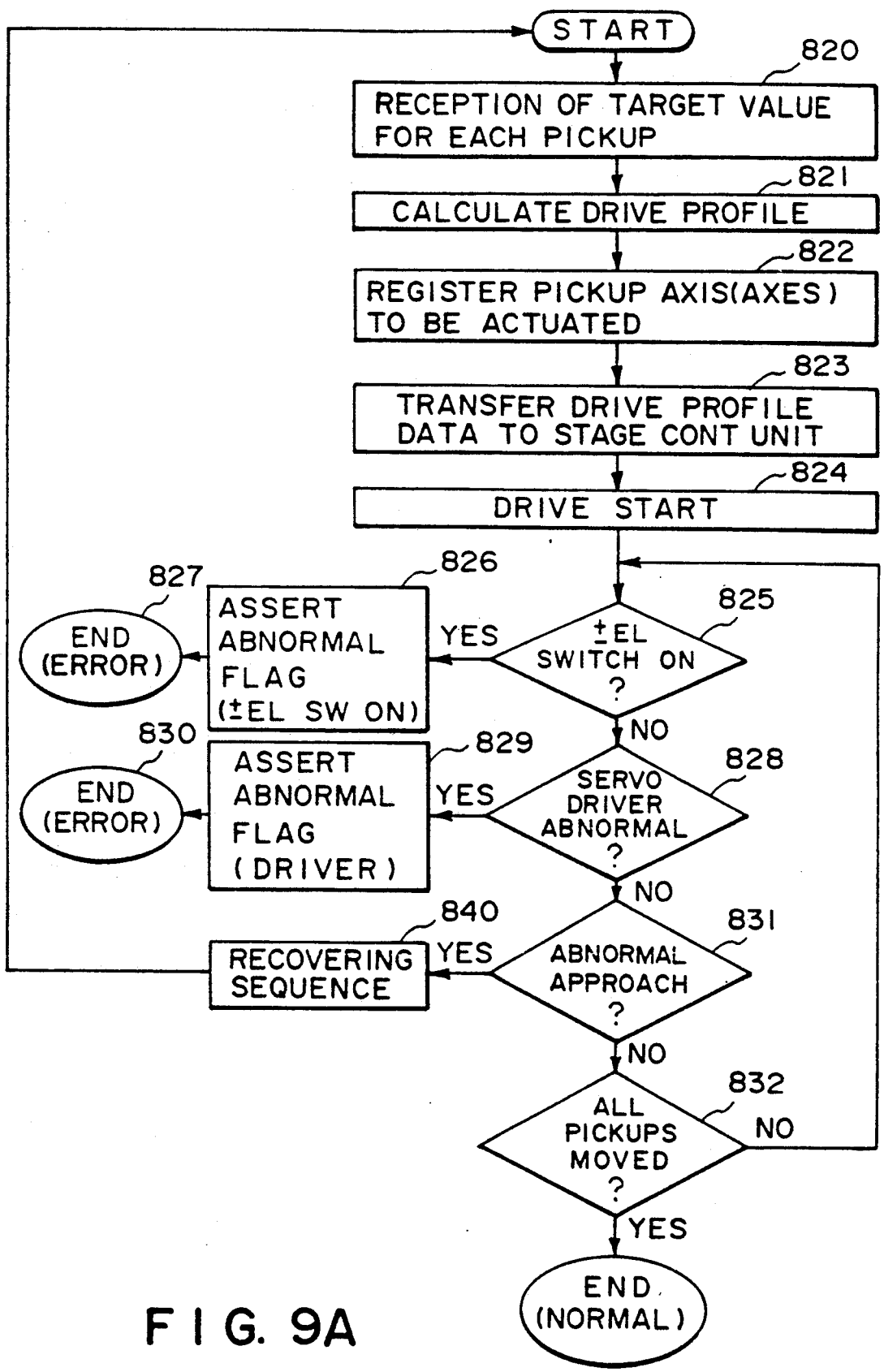

In the sequence of FIG. 8B, if at step 804 extraordinary approach is detected, then at step 805 those pickups with respect to which the extraordinary approach has been detected are searched out of the pickups 1a-1d. Then, to those pickups with respect to which the extraordinary approach has been detected, limitations such as illustrated in blocks 806a-806d are ordered to the motion of corresponding pickups. For example, if extraordinary approach is detected with respect to the pickup 1a, the sequence goes to step 806a whereat the movement of the pickup 1a in the α+ direction and the β- direction (see FIG. 6A) is prohibited and, additionally, the movement of the pickup 1b in the α+ direction and the β+ direction is prohibited. After this, at step 807, the restoring sequence such as initialization or the like of the pickup stages 114 is effected while observing the limitations set at step 806a. Then, the sequence goes to step 808 and normal operation is recovered Of these two sequences, the sequence shown in FIG. 8A is applicable to any one of the examples of FIGS. 6A-6C, the sequence shown in FIG. 8B is applicable to the examples of FIGS. 6A and 6C FIGS. 9A and 9B illustrate another example of a processing sequence. In FIG. 9A, when the start is instructed, at step 802 the main-part control unit 423 is supplied with destinations (target positions) for movement of the pickups 1a-1d, respectively, from the main process unit. In response thereto, at step 821, the control unit 423 calculates drive profiles for the stages 114 corresponding to the pickups 1a-1d, respectively, for control of the movement of these pickups. Then, at step 822, the direction or directions of those drive axes, of all the drive axes (α and β) of the pickups 1a-1d, which are to be actuated at this time, are registered in a memory (see FIG. 10, part (a)). As regards the axes to be actuated at this time, data "1" is set at the corresponding addresses in the memory of FIG. 10, part (a). As regards the remaining axes, not to be actuated, data "0" is set to the corresponding addresses.

Subsequently, at step 823, the control unit 423 transfers the calculated drive profile data to the pickup stage control units 501-504 of the pickups 1a-1d. In response thereto, at step 824, the pickup stage control units 501-504 produce drive signals, such as described hereinbefore to the corresponding α axis drives and β axis drives (FIG. 5) so as to control the movement of the corresponding pickups 1a-1d, to thereby start the movement of those of the pickups 1a-1d which are to be driven at this time.

After this, at step 825, discrimination is made as to whether an end limit switch EL of each actuator 101 or 102 has detected the corresponding pickup stage 114. More specifically, each of the pickups 1a-1d is equipped with actuators 101 and 102, and each actuator is equipped with an end limit switch EL. This end limit switch is adapted to detect whether a corresponding pickup stage 114 has moved to an end position of its movable range with respect to the ±α axis direction or ±β axis direction. If the end limit switch EL has been turned on and thus the corresponding pickup stage 114 has been detected, the sequence goes to step 826 and a corresponding abnormal flag is set, to provide information of extraordinariness to an operator. Thereafter, at step 827, the movement of the pickups 1a-1d is stopped or prohibited. If the end limit switch EL is held off, the sequence goes to step 828 whereat discrimination is made a to whether there is any extraordinariness in the servo driver. For example, discrimination is made as to whether there is extraordinariness, such as line disconnection of the motor or encoder of the actuator 101 or 102. If any extraordinariness is discriminated, then the sequence goes to step 829 and a corresponding abnormal flag is set to provide information of extraordinariness to the operator. Thereafter, at step 830, the movement of the pickups 1a-1d is stopped or prohibited. If the servo driver is normal, the sequence goes to step 831 and discrimination is made as to whether the approach sensor means (bumpers) shown in FIGS. 6A-6C is turned on or not.

If the approach sensor means does not detect extraordinary approach, the sequence goes to step 832 and discrimination is made, by using the outputs of the encoders of the actuators 101 and 102, as to whether the pickups 1a-1d have moved to their destinations. If not, the sequence goes back to step 825 and the above-described operations are repeated. If the pickups have moved to the destinations, the movement is finished at this moment.

If any extraordinary approach is detected at step 831, the movement of those pickups being driven at that moment is stopped and, step 840, the restoring sequence to be described later is executed. Upon completion of this sequence, the device is rendered into a stand-by state, waiting for a start instruction.

FIG. 9B illustrates details of the restoring sequence at step 840. Now, this restoring sequence will be explained in conjunction with the structure of the FIG. 6A example. Upon start of the restoring sequence, at step 841, the data of those of the drive axes (current drive axes) registered in the memory of FIG. 10 (step 822) and to be actuated at this time, is referred to. Subsequently, at step 842, those of the approach sensors (bumpers 5aL, 5bL, 5cL and 5dL) of the pickups 1a-1d with respect to which the extraordinary approach has been detected, are searched.

Subsequently, at step 843, by using the data for the current drive axes (α and β axes of each pickup) to be actuated, having been referred to at step 822, and by using the data of the sensor (pickup) with respect to which the extraordinary approach has been detected (step 823), those of the α and β axes of each pickup which are to be initialized, are determined. For example, when extraordinary approach has been detected with respect to the bumper 5aL mounted to the pickup 1a, if the registered data regarding the α and β axes of the pickups 1a and 1b is such as illustrated in parts (b)-(g) of FIG. 10, only the drive registered axes, namely, only those axes which are to be actuated at that time, are selected as the subject of initialization. If, like the case of part (h) of FIG. 10, the current drive registered state differs from those of parts (b)-(g), then all the α and β axes of the pickups 1a and 1b are selected as the subject of initialization.

If the bumper 5aL detects extraordinary approach as in this case, it is not necessary to take into account the state of drive of the pickups 1c and 1d. The initialization of them may be made together with the initialization of the pickups 1a and 1b or, alternatively, the initialization of them may not be effected. FIG. 10, part (b), illustrates a case where each of the pickups 1a and 1b is driven in its α axes direction. FIG. 10, part (c), illustrates a case where each of the pickups 1a and 1b is driven only in its β axis direction. FIG. 10, part (d), illustrates a case where the pickup 1a is driven only in its α axis direction. FIG. 10, part (e), illustrates a case where the pickup 1a is driven only in its β axis direction. FIG. 10, part (f), illustrates a case where the pickup 1b is driven only in its α axis direction. FIG. 10, part (g), illustrates a case where the pickup 1b is driven only in its β axis direction.

After determination of the axis or axes to be initialized (step 843), discrimination is made at step 844 as to whether the initialization is to be made with respect to all the axes of the pickups 1a and 1b (and 1c and 1d). If it is discriminated to be necessary, at step 846 a corresponding command is produced and the restoring sequence 840 is finished. If not, then at step 845 the initialization of the determined axis or axes (step 843) is effected, and the restoring sequence 840 is completed.

In the processing sequence of FIGS. 9A and 9B, it is not always necessary to execute the initialization of all the axes, when any extraordinary approach is detected. Therefore, it is possible to reduce the time from detection of the extraordinary approach to the restoration of a normal state. It is to be noted that this processing sequence is applicable also to the structure of the FIG. 6C example.

While the invention has been described with reference to the structures disclosed herein, it is not confined to the details set forth and this application is intended to cover such modifications or changes as may come within the purposes of the improvements or the scope of the following claims.

What is claimed is:

1. An alignment system usable in an exposure apparatus for printing a pattern of a mask on a wafer, for aligning the mask and the wafer, said system comprising:
    a plurality of position detecting devices;
    a plurality of driving stages corresponding to said position detecting devices, respectively, each driving stage being adapted to move a corresponding one of said position detecting devices two-dimensionally along a plane which is substantially opposed to the mask;
    a plurality of contacts corresponding to said position detecting devices, respectively, each contact being provided at an end portion of a corresponding one of said position detecting devices, along said plane and facing the pattern side;
    detecting means for detecting mutual approach of said position detecting devices through at least one of said contacts; and
    control means for controlling movement of at least one of said driving stages in accordance with the detection by said detecting means.

2. A system according to claim 1, wherein said control means controls the movement of at least one of said driving stages so that at least one of said position detecting devices is moved away from another position detecting device, in response to detection of extraordinary approach by said detecting means.

3. A system according to claim 1, wherein each of said contacts includes a resiliently deformable electrode member, and wherein an electric signal is applied to said detecting means in response to deformation of said electrode member.

4. An alignment system usable in an exposure apparatus for printing a pattern of a mask on a wafer, for aligning the mask and the wafer, said system comprising:
    at least three position detecting devices provided around the pattern of the mask as the mask is introduced into the exposure apparatus;
    at least three driving stage corresponding to said position detecting devices, each driving stage being adapted to move a corresponding one of said position detecting devices two-dimensionally along a plane which is substantially opposed to the mask;
    a plurality of contacts corresponding to said position detecting devices, each contact being provided at an end portion of a corresponding one of said position detecting devices, along said plane and facing the pattern side; and
    control means effective to prohibit the movement of at least one of said driving stages when extraordinary approach between any position detecting devices is detected through at least one of said contacts.

5. A system according to claim 4, wherein each of said contacts includes a resiliently deformable electrode member, and wherein an electric signal is applied to said detecting means in response to deformation of said electrode member.

6. A system according to claim 5, wherein each of said position detection devices is provided with a plurality of contacts.

7. An alignment system for use in an exposure apparatus for exposing a substrate with a radiation beam, said system comprising:
    a plurality of mark detecting units for detecting at least one alignment mark formed on the substrate, wherein at least one of said mark detecting units comprises a contacting element provided at an end of said at least one unit to oppose the alignment mark;
    a plurality of driving stages respectively corresponding to said plurality of mark detecting units, each of said driving stages being adapted to move a corresponding mark detecting unit substantially along the substrate; and
    detecting means for detecting relative closeness of said mark detecting units through said at least one contacting element.

8. A system according to claim 7, wherein said detecting means comprises means for detecting abnormal closeness of said mark detecting units.

9. A system according to claim 7, wherein said at least one contacting element comprises resiliently deformable electrodes, and applies an electric signal to said detecting means in accordance with deformation of at least one of said electrodes.

10. An alignment system for use in an exposure apparatus for exposing a substrate with a radiation beam, said system comprising:
    a plurality of mark detecting units for detecting at least one alignment mark formed on the substrate;
    a plurality of driving stages respectively corresponding to said mark detecting units, each of said driving stages being adapted to move a corresponding mark detecting unit substantially along the substrate; and a plurality of contacting elements respectively provided on said plurality of mark detecting units, each of said contacting elements being disposed at an end of a corresponding mark detecting unit to oppose the alignment mark, for preventing mutual contact of said plurality of mark detecting units.

11. An alignment method for manufacturing semiconductor devices, said method comprising the steps of:

providing a plurality of mark detecting units each being substantially movable along a substrate;

providing each of the mark detecting units with a contacting element at an end of a respective unit to oppose an alignment mark of the substrate;

moving at least one of the mark detecting units for detection of the alignment mark of the substrate;

detecting any relative abnormal closeness of the mark detecting units through the contacting elements of the mark detecting units; and detecting the alignment mark of the substrate by using at least one of the mark detecting units when no relative abnormal closeness of the mark detecting units exists.

* * * * *

UNITED STATES PATENT AND TRADEMARK OFFICE
CERTIFICATE OF CORRECTION

PATENT NO. : 5,112,133
DATED : May 12, 1992
INVENTOR(S) : Hiroshi Kurosawa, et al.

It is certified that error appears in the above-identified patent and that said Letters Patent is hereby corrected as shown below:

COLUMN 1

Line 39, "accomplished" should read --accomplished.--;
    Line 43, "mask" should read --mask.--; and
    Line 64, "wafer 202" should read --wafer 202.--.

COLUMN 2

Line 57, "30=0.06" should read --3σ=0.06--.

COLUMN 4

Line 54, "stage 105." should read --stage 106.--.

COLUMN 5

Line 16, "ga" should read --gas--; and
    Line 41, "mark 415," (first occurrence) should read --mark 416,--.

COLUMN 6

Line 36, "provided" should read --provided.--;
    Line 61, "unit 304," should read --unit 423,--;
    Line 63, "ga" should read --gas--; and
    Line 65, "interfaces 421" should read --interface 421--.

COLUMN 7

Line 20, "comprises" should read --comprise--.

UNITED STATES PATENT AND TRADEMARK OFFICE
CERTIFICATE OF CORRECTION

PATENT NO. : 5,112,133
DATED : May 12, 1992
INVENTOR(S) : Hiroshi Kurosawa, et al.

It is certified that error appears in the above-identified patent and that said Letters Patent is hereby corrected as shown below:

COLUMN 8

Line 7, "bumpers" should read --bumper--.

COLUMN 9

Line 30, "recovered" should read --recovered.--; and
Line 34, "6C" should read --6C.--.

COLUMN 10

Line 11, "a" should read --as--.

COLUMN 11

Line 8, "axes" should read --axis--.

UNITED STATES PATENT AND TRADEMARK OFFICE
CERTIFICATE OF CORRECTION

PATENT NO. : 5,112,133

DATED : May 12, 1992

INVENTOR(S) : Hiroshi Kurosawa, et al.

It is certified that error appears in the above-identified patent and that said Letters Patent is hereby corrected as shown below:

COLUMN 12

Line 12, "stage" should read —stages—.

Signed and Sealed this

Twelfth Day of October, 1993

BRUCE LEHMAN

Attest:

Attesting Officer

Commissioner of Patents and Trademarks